(12) United States Patent
Wan et al.

(10) Patent No.: US 11,581,671 B2
(45) Date of Patent: Feb. 14, 2023

(54) INTEGRATED CIRCUIT PACKAGE SOCKET HOUSING TO ENHANCE PACKAGE COOLING

(71) Applicant: Intel Corporation, Santa Clara, CA (US)

(72) Inventors: Zhimin Wan, Chandler, AZ (US); Steven A. Klein, Chandler, AZ (US); Chia-Pin Chiu, Tempe, AZ (US); Shankar Devasenathipathy, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 814 days.

(21) Appl. No.: 16/361,537

(22) Filed: Mar. 22, 2019

(65) Prior Publication Data

US 2020/0303852 A1 Sep. 24, 2020

(51) Int. Cl.
| | | |
|---|---|---|
| *H01R 13/62* | (2006.01) | |
| *H01R 12/70* | (2011.01) | |
| *H01R 13/50* | (2006.01) | |
| *H01R 13/24* | (2006.01) | |
| *H01R 12/71* | (2011.01) | |

(52) U.S. Cl.
CPC ....... *H01R 12/7076* (2013.01); *H01R 12/716* (2013.01); *H01R 13/24* (2013.01); *H01R 13/50* (2013.01)

(58) Field of Classification Search
CPC ............................ H01R 13/2442; H01R 12/88
USPC ................................................... 439/330, 70
See application file for complete search history.

(56) References Cited

U.S. PATENT DOCUMENTS 4,684,184 A * 8/1987 Grabbe ................ H05K 7/1069
439/71
8,025,531 B1 * 9/2011 Zhang ................ H01R 13/6588
439/607.05

* cited by examiner

*Primary Examiner* — Phuong K Dinh
(74) *Attorney, Agent, or Firm* — Essential Patents Group, LLP.

(57) ABSTRACT

An integrated circuit (IC) socket comprising a housing with a land side, an opposing die side, and sidewalls around a perimeter of the housing. The housing comprises a first dielectric. A plurality of socket pins extends from the land side of the housing through socket pin holes in the housing over the die side of the housing. A second dielectric is within the interstitial regions between the socket pins and sidewalls of the socket pin holes. A frame structure extends around at least a portion of the perimeter of the housing, and a mesh structure is embedded within the first dielectric. The mesh structure has plurality of mesh filaments extending between the plurality of socket pin holes and coupled to the frame structure.

20 Claims, 8 Drawing Sheets

INTEGRATED CIRCUIT PACKAGE SOCKET HOUSING TO ENHANCE PACKAGE COOLING

BACKGROUND

Thermal management in integrated circuit (IC) packaging containing single or multiple integrated circuits (ICs) is becoming an increasingly important issue. Packaging for modern high-performance integrated circuits must contend with increasingly larger scale microelectronic circuit integration, including vertical integration of multiple integrated circuits. Smaller form factors are associated with increasingly higher power densities, having concomitant heat transfer challenges. High-performance ICs, such as modern multi-core microprocessors and high-bandwidth memory devices, demand large electrical current through individual signal and power interconnects. Devices may demand up to 1000 W of power. High-density IC chips with very large land grid arrays having pin counts of 2000-4000 in some instances require socket pit pitches well under 1000 microns.

When mounted in an IC socket on a computer motherboard, power densities through individual interconnect pins in the socket may cause pin temperature to rise to hundreds of degrees, in some instances melting the pins. Temperature rise in the contact pins may cause burning and decomposition of thermosetting plastic socket housing materials, deforming the socket. Demand for higher microprocessor performance in video and gaming applications where repeated or extended bursts are required has further motivated development of advanced socket designs to prevent or mitigate problems associated with pin heating.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
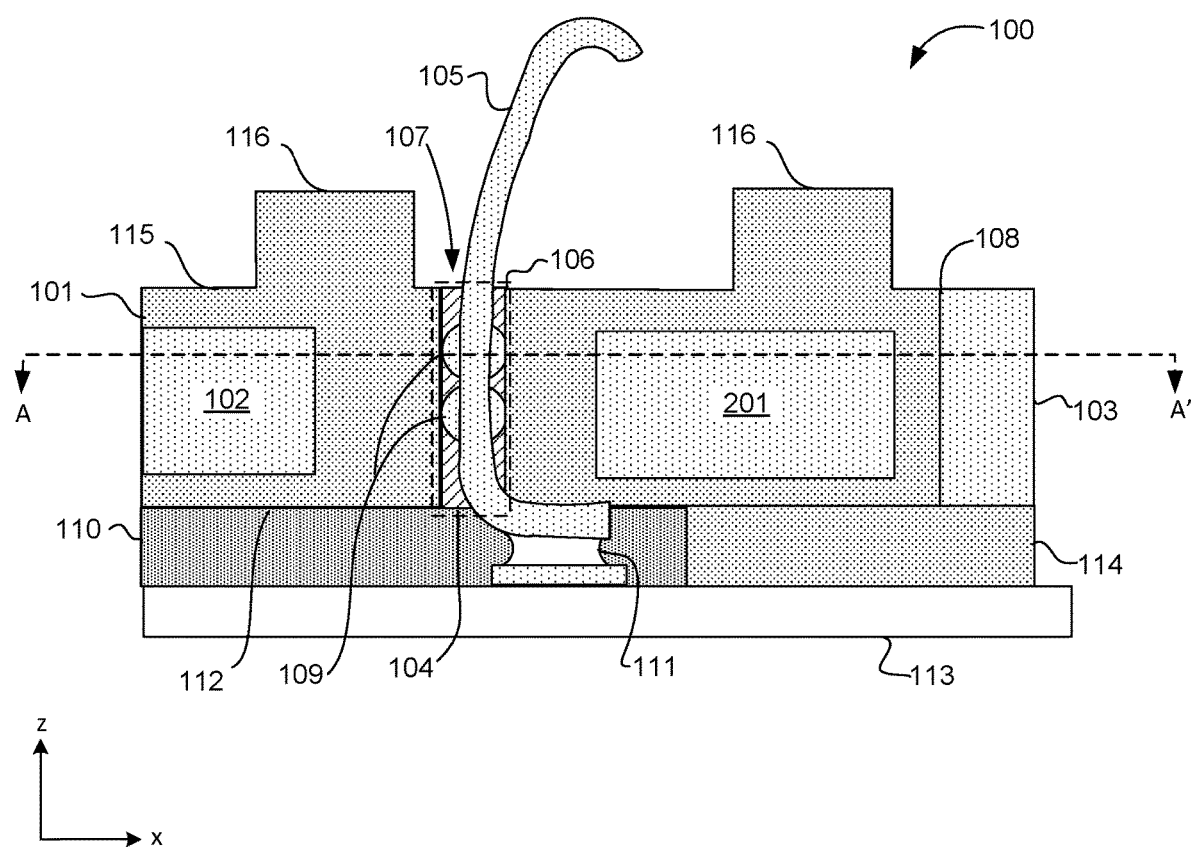
FIG. 1 illustrates a cross-sectional view in the x-z plane of a IC socket, according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

Here, the term "die" generally refers to a carrier structure for an integrated circuit. The term "die" implies a single unit, to be distinguished from the plural "dice". Throughout this specification, however, the term "dies" will be used as the plural form of "die". A number of identical dies may be "singulated", or diced from a semiconductor wafer, such as a silicon wafer, by mechanical sawing or laser cutting.

Here, the term "package" generally refers to a structure including one or more integrated circuit dies bonded to a suitable substrate, such as a printed circuit board or embedded in a layered substrate (e.g., a bumpless build-up layer (BBUL) package). In common vernacular, an integrated circuit package may be referred to as a "chip", although the term "chip" technically refers to a die in the package. The one or more dies may be encapsulated for protection from the environment in a dielectric material, such as an epoxy resin or a ceramic composite, which is molded into a block. Alternatively, the package may be without encapsulation, allowing the one or more dies to be exposed. The substrate generally comprises electrical interconnects on its bottom surface, which may be a pin array for insertion into a socket, or electrical contact pads for permanent solder-bonding to a printed circuit board, such as a computer motherboard or daughterboard.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to the PCB.

The vertical orientation is in the z-direction and it is understood that recitations of "top", "bottom", "above"

"over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure. An integrated circuit (IC) package socket comprising a housing exhibiting high thermal conductivity for enhancing thermal management of attached IC devices is described. The disclosed IC socket comprises a high thermal conductivity (henceforth, "high-k", where k is the coefficient of thermal conductivity) but electrically insulating material for the socket housing. In some embodiments, the housing dielectric material has a k of 100 W/mK or higher. In some embodiments, the housing material comprises a low-k material, such as an organic thermosetting plastic without high-k fillers. An exemplary material may have a k of 1 W/mK or less.

In some embodiments, a metal mesh structure is embedded within the dielectric housing to enhance thermal conduction within the interior of the housing and more rapidly channel heat away from the socket pins. The inner mesh structure may comprise embedded filament-like members that extend though the housing between the socket pins. In some embodiments, an outer metal frame surrounds the perimeter of the housing, and is bonded to the inner mesh structure. The inner mesh structure gathers heat that is generated by large power dissipation within the pins and transport it to the outer metal frame, where it may be transferred to external metal structures, such as a bolster plate surrounding the socket.

The transfer of heat from the socket pins to the inner mesh is facilitated by the housing material between the individual socket pins and adjacent mesh filaments. In some embodiments, a thermal grease or thermal gel is contained within pin insertion holes in the disclosed socket housing. The thermal grease or gel may at least partially eliminate the air gap between the contact pin and the sidewalls of the pin insertion holes in the socket housing, displacing interstitial air and providing a path of low thermal resistance for heat transfer from the pin to the socket housing material.

In some embodiments, a high-k underfill is injected under the socket housing between solder joints, for example when the disclosed IC socket is mounted on a printed circuit board (PCB). The inclusion of a high-k underfill may promote lateral transfer of heat from the solder joint to nearby portions of the housing.

FIG. 1 illustrates a cross-sectional view in the x-z plane of IC socket 100, according to some embodiments of the disclosure.

IC socket 100 comprises housing 101, mesh network filaments 102 embedded within housing 101, outer frame 103 and thermal interface material 104 between socket pin 105 and sidewall 106 of pin insertion hole 107. In some embodiments, housing 101 comprises a high-k dielectric material (e.g., k exceeding 100 W/mK. The dielectric material comprised by housing 101 may further have high electrical resistivity (e.g., bulk resistivity exceeding 1 gigohm-cm). In some exemplary embodiments, housing 101 comprises an organic or an inorganic composite, comprising particles of aluminum nitride (k~140-170 W/mK), boron nitride (k~600-740 W/mK) diamond (k~2000 W/mK) in a dielectric matrix. The dielectric matrix may comprise a ceramic (e.g. aluminum oxide), or organic polymer such as an epoxy resin. Composites that have an organic or inorganic matrix may have lower overall thermal conductivities than the pure fillers. In some embodiments, housing 101 comprises polymer or ceramic dielectric material without a high-k filler, and may have a k of 1 W/mK or less.

Filaments 102 and 201 (minor filaments 102 and major filaments 201; see FIGS. 2 and 3) are part of a mesh network. FIG. 1 illustrates a cross-sectional view of filament members that extend in the y-dimension above and below the plane of the figure. In some embodiments, the mesh network comprising filaments 102 and 201 is an embedded skeletal structure within housing 101. Mesh filaments 102 and 201 may provide some mechanical support to IC socket 100. In some embodiments, filaments 102 and 201 extend in both the x and y dimensions, (e.g., see FIG. 2). In some embodiments, filaments 102 and 201 are joined metallurgically to each other, and to outer frame 103, which extends along housing sidewalls 108 around the perimeter of housing 101.

In some embodiments, filaments 102 extend between socket pin holes 107. Each socket pin hole 107 may be flanked (in both the x- and y-dimensions, see FIG. 2) by filaments 102. Width dimensions of mesh network filaments 102 may vary according to the pin pitch (see description below and FIG. 2). As an example, a pin pitch of 1000 microns may restrict widths of filaments 102 to 300-500 microns, depending on diameter of socket pin holes 107. Dimension details are given below. Socket pin holes may be organized in blocks containing square or hexagonal arrays of regularly spaced holes (e.g., a 10×10 array) or more (e.g., a 20×10 or a 20×20 array, etc.). Blocks of socket pins may be separated by shared perimeters having no pins, and may ranging in width from 200 to 500 microns.

In some embodiments, major filaments 201 extend within the shared perimeter regions between blocks of pins, and have widths ranging between 500 and 1000 microns. Electrically insulating material of housing 101 isolates metal filaments 102 and 201 from socket pins 105. Materials employed in mesh filaments 102 and 201 may have thermal conductivities ranging between 300 and 500 W/mK. In some embodiments, minor and major filaments 102 and 201, respectively, comprise a thermally conductive material such as, but not limited to, a metal. In some exemplary embodiments the metal is predominantly copper, gold, nickel, silver or aluminum.

In some embodiments, material 104 may fill, or partially fill, interstitial spaces between a portion of socket pin 105 within socket pin hole 107 as the medium surrounding the portion of socket pin 105 within housing 101. Heat generated in socket pin 105 during operation of the device may be transported through material 104 to hole sidewall 106 and into the bulk of housing 101. Material 104 may have a relatively high thermal conductivity (e.g., significantly greater than air) for improved heat transfer from socket pin 105 to high-k housing 101. Material 104 may have a minimum k of approximately 1 W/mK. The small distance between socket pin 105 and hole sidewall 106 together with the relatively high k of thermal material 104 presents a path of low thermal resistance from socket pin 105 to the bulk of housing 101. Material 104 may comprise a thermal grease or a thermal gel. In some embodiments, material 104 comprises particles of aluminum nitride, boron nitride or diamond in a silicone matrix.

A small amount of direct conductive transfer of heat from socket pin 105 to sidewall 106 of pin insertion hole 107 may occur by contact of fitting bumps 109, which are protruding portions of socket pin 105, and press-fit against hole sidewall 106 when socket pin 105 is inserted into socket pin hole 107. Generally, the contact area between fitting bumps 109 and hole sidewall 106 is relatively small compared to the contact area that may be covered by thermal material 104 with hole sidewall 106, so relatively little heat may be transferred through fitting bumps 109.

In some embodiments, underfill 110 is under the land side, or bottom surface 112, of housing 101 at the level of solder joints 111 between bottom surface 112, and printed circuit board (PCB) 113. Bottom standoffs 114 extend below the plane of bottom surface 112 and allow for a gap between PCB 113 and bottom surface 112. Underfill 110 may enable heat conduction away from solder joints 111 to the housing 101, spreading to bottom surface 112 and bottom standoffs 114. In some embodiments, underfill 110 comprises anepoxy composite that may have a relatively high thermal conductivity (e.g., 1 W/mK or higher). The epoxy composite may have any suitablefill material, with some examples including aluminum nitride or boron nitride. Underfill 110 may be a board-level underfill (BLUF), introduced by capillary action under IC socket 100 after it is solder-bonded to PCB 113. Underfill 110 may also enhance mechanical stability of solder joints 111, as do conventional BLUFs.

Figure 4:
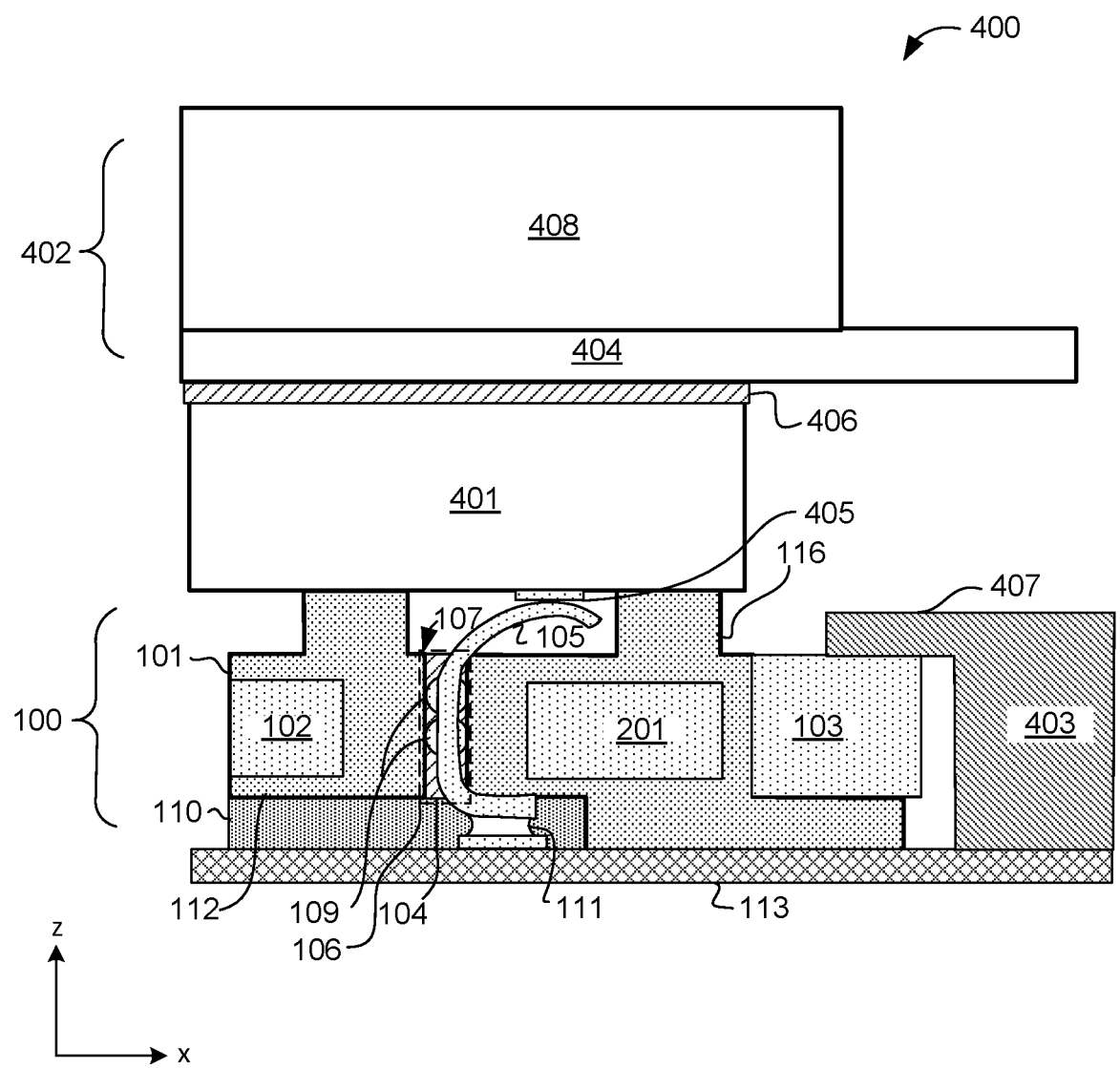
FIG. 4 illustrates a cross-sectional view in the x-z plane of a microprocessor mounting assembly a comprising IC socket, according to some embodiments of the disclosure.

Housing 101 comprises a top surface 115, having upper standoffs 116 for seating of an IC device, such as a microprocessor, (e.g., IC device or microprocessor 401 shown in FIG. 4). Upper standoffs enable robust contact of socket pins 105 with a land grid array (LGA) of the IC device, when the IC device is seated in IC socket 100. As socket pins 105 may extend above the level of upper standoffs 116, they may be prevented from bending at too sharp of an angle when an IC device is seated on upper standoffs 116. A height differential between socket pins 105 and upper standoffs 116 may allow an amount of bend in socket pins 105 that is within the range of elastic deformation of the pin material (e.g., copper or copper-beryllium alloy). Upper standoffs may prevent crushing the pins and permanently deforming them during seating of the IC device. In this manner, permanent (e.g., plastic) deformation of socket pins 105 is substantially prevented.

Figure 2:
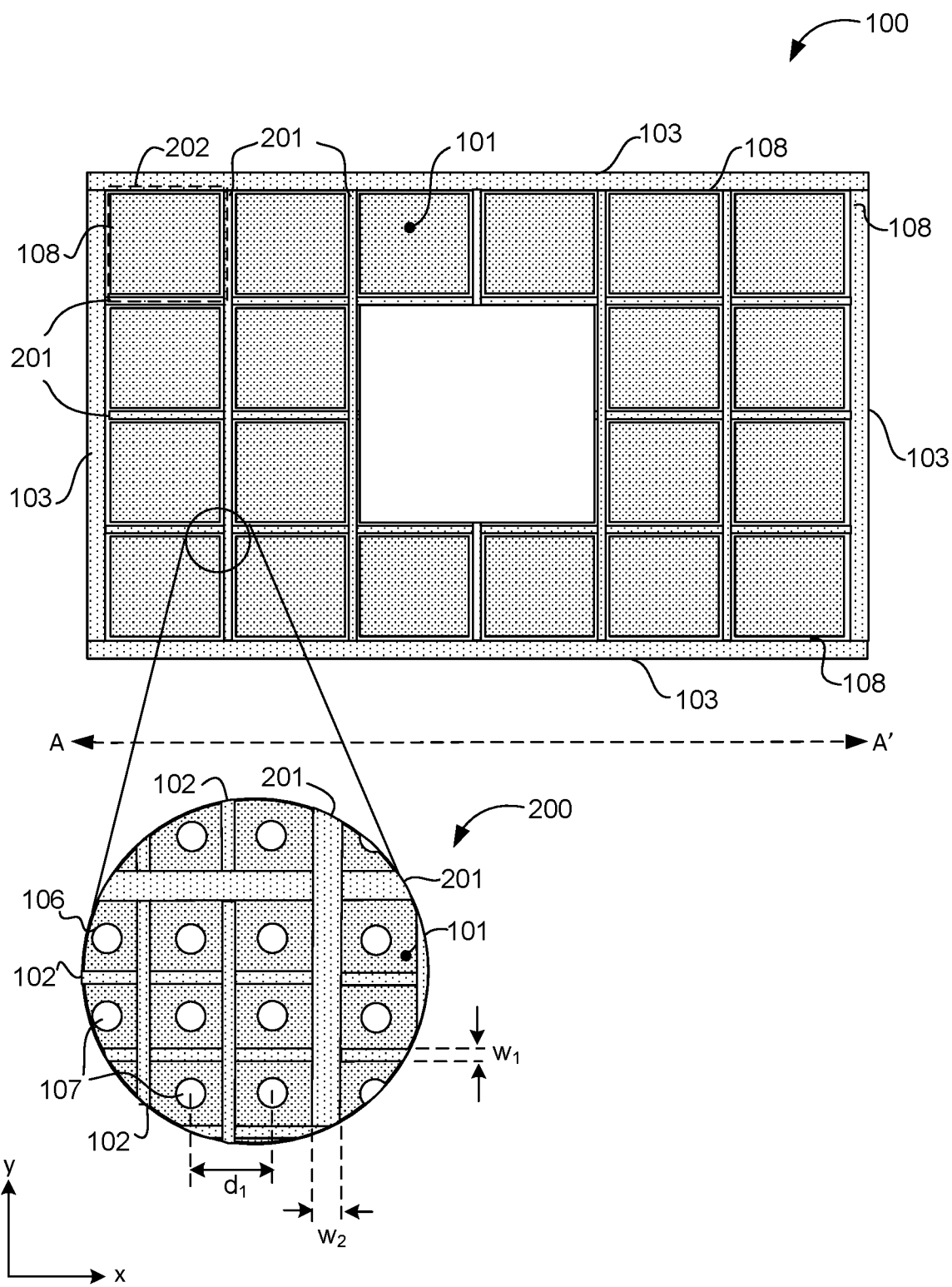
FIG. 2 illustrates a plan view in the x-y plane of a IC socket, showing a rectilinear mesh network embedded within the socket housing, according to some embodiments of the disclosure.

FIG. 2 illustrates a plan view in the x-y plane of IC socket 100, showing a rectilinear mesh network 200 embedded within housing 101, according to some embodiments of the disclosure.

FIG. 2 shows a cross-sectional plan view taken along plane A-A' in FIG. 1, cutting through the interior of housing 101 to reveal rectilinear mesh network 200, comprising minor filaments 102 and major filaments 201, each type of filament extending in mutually orthogonal directions (e.g., in the x- and y-directions). The inset shows a magnified view of the encircled region within housing 101. Mesh network 200 is embedded in housing 101, denoted by high-density stippled area. Mesh network 200 comprises major filaments 201 and minor filaments 102. Socket pin holes 107 are arranged in an square array having a pitch (distance between hole centers) $d_1$. Minor filaments form a fine mesh that runs between socket pin holes 107, and have a width $w_1$ that is less than pitch $d_1$. In some examples, pitch $d_1$ may range between 500 microns and 2000 microns. Socket pin hole diameters may range between 200 and 1000 microns. Width $w_1$ of minor filaments may range between 100 microns and approximately 500 microns, for example. Width $w_1$ may be predetermined to optimize the proximity of socket pin holes 107 to minor filaments 102 (e.g., the distance between socket pin hole sidewalls 106 and the edges of minor filaments 102). Width $w_2$ of major filaments may range between 1000 and 2000 microns, for example.

As shown in the inset of FIG. 2, major filaments 201 extend the length (x-dimension) and breadth (y-dimension) of housing 101 between members of outer frame 103 extending along housing sidewalls 108. In some embodiments, major filaments 201 are metallurgically joined to outer frame 103. Minor filaments 102 extend in orthogonal directions (e.g., x- and y-directions) between individual socket pin holes 107 to major filaments, as shown in FIG. 2. In some embodiments, minor filaments 102 are metallurgically joined to major filaments 201. In some embodiments, mesh network 200 is a contiguous structure.

Major filaments 201 of mesh network 200 may divide IC socket 100 into blocks of pin arrays 202 since pins cannot cross through major filaments 201. Perimeters around each pin array block 202 may have widths of 2000 microns or less. Within each block 202, minor filaments 102 are arranged in a sub-mesh and extend to major filaments 201. In some embodiments, minor filaments 102 are metallurgically joined to each other at their crossing point(s), and at point(s) of contact with major filaments 201. In some embodiments, major filaments 201 are also metallurgically joined to each other at their crossing point(s).

In some implementations, large current flows of several amperes through socket pins (e.g., socket pins 105, not shown) may be localized to hot spots within an attached microprocessor device. Currents of several amperes may flow through a single socket pin, or be distributed over a small group of socket pins, generating large $I^2R$ power dissipation within the pins.

According to some embodiments, heat from socket pins may be transferred to housing 101 through thermal grease or gel (e.g., thermal material 104) in the interstitial spaces between the socket pins and the hole sidewalls 106. Proximity of socket pin holes 107 to minor filaments 102 or major filaments 201 enables rapid transfer of heat along minor filaments to major filaments 201 of mesh network 200, and to outer frame 103. The minor and major filaments may have a thermal conductivity that may be at least twice that of the housing material. As an example, copper has a thermal conductivity close to 500 W/mK. Aluminum nitride or composites containing aluminum nitride filler may have has thermal conductivity ranging between 100 and 170 W/mK.

While the thermal conductivity of the housing material is smaller than that of mesh network 200, the small distance between socket hole 107 and minor (or major) filaments may be sufficient to present a path of low thermal resistance to the transport of heat from pin to filament. Flanking socket pin holes 107 on four sides by minor filaments 102 enables collection 360° around socket pin holes 107 of most of the heat spreading radially from hole sidewalls 106.

Figure 3:
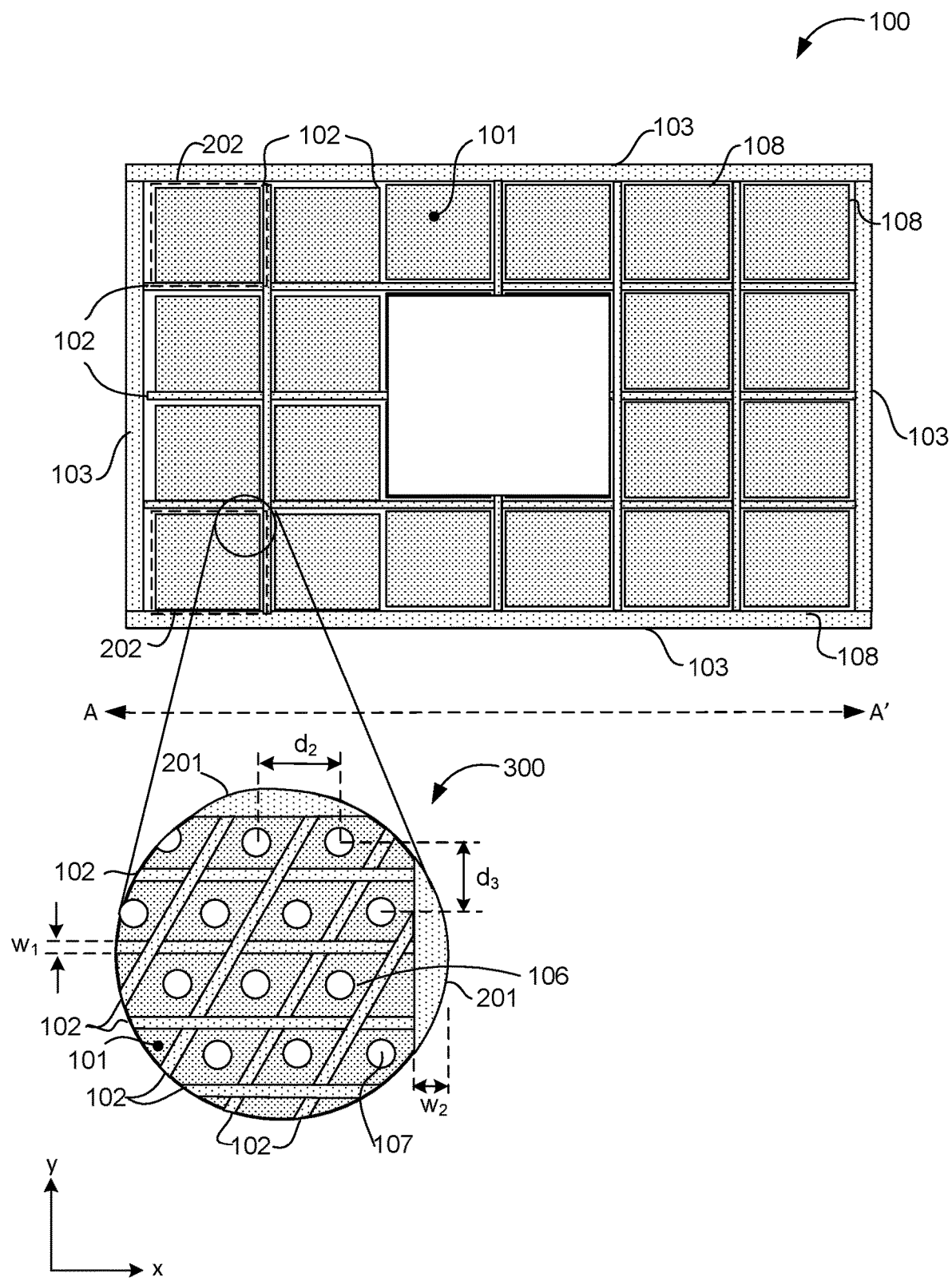
FIG. 3 illustrates a plan view in the x-y plane of a IC socket, showing a hexagonal mesh network embedded within the socket housing, according to some embodiments of the disclosure.

FIG. 3 illustrates a plan view in the x-y plane of IC socket 100, showing hexagonal mesh network 300 embedded within housing 101, according to some embodiments of the disclosure.

FIG. 3 shows a cross-sectional plan view taken along plane A-A' in FIG. 1, cutting through the interior of housing 101 to reveal hexagonal mesh network 300, comprising filaments 102 and mesh members 201 extending in directions compatible with hexagonal symmetry (e.g., in directions parallel to the x-axis and approximately 60° from the x-axis). Similar to rectilinear mesh network 200, hexagonal mesh network 300 is embedded within housing 101. Major filaments 201 of mesh network 300 may divide IC socket 100 into blocks of pin arrays 202 since pins cannot cross through major filaments 201. Perimeters around each pin array block 202 may have widths of 2000 microns or less. Within each block 202, minor filaments 102 are arranged in a sub-mesh and extend to major filaments 201 extending through the perimeter. In some embodiments, minor filaments 102 are metallurgically joined to each other their crossing points, and to points of contact with major filaments 201. In some embodiments, major filaments 201 are also metallurgically joined to each other at their crossing points.

The inset in FIG. 3 reveals details of mesh network 300 with a pin array block 202 in the lower left corner of the figure. The details shown the inset may be repeated for each pin array block 202. Socket pin holes 107 are arranged in hexagonal array. Minor filaments 102 run between socket pin holes 107, extending along the x-direction in the figure, and at approximately a 60° angle (or at a suitable oblique angle) with respect to the x-direction, forming rhombic regions around each socket pin hole 107. In the hexagonal pin array, socket pin holes 107 may be separated by two pitches, $d_2$ and $d_3$, which may differ. In some embodiments, $d_2$ and $d_3$ range between approximately 500 and 2000 microns. Widths $w_1$ and $w_2$ of minor and major filaments 102 and 201, respectively, may be the same as described for mesh network 200. Socket pin holes 107 diameters have also been described above.

Distances between hole sidewalls 106 and minor filaments 102 forming rhombic domains around socket pin holes 107 are symmetrical but not equal in all directions around socket pin holes 107, as in mesh network 200. However, average distances in mesh network 300 may be similar to those in mesh network 200.

FIG. 4 illustrates a cross-sectional view in the x-z plane of microprocessor mounting assembly 400 comprising IC socket 100, according to some embodiments of the disclosure.

Microprocessor mounting assembly 400 comprises IC socket 100, microprocessor 401 installed on IC socket 100, heat sink 402 over microprocessor 401 and bolster plate 403 around IC socket 100. IC socket 100 is surface mounted on PCB 113. Heat sink 402 may comprise a block of multiple fins 408 for heat dissipation, and base plate 404. Base plate 404 may have bolt holes for passage of bolts extending from bolster plate 403. In some embodiments, base plate 404 comprises a cold plate (not shown) for enhancement of microprocessor cooling. Base plate 404 may have tubing within the cold plate portion of base plate 403 for circulation of water or other fluids as coolants. In some embodiments, heat sink 402 comprises one or more active thermoelectric cooling elements (not shown) to enhance cooling of microprocessor 401.

Socket pins 105 may be coupled to trace routing (not shown) in and on PCB 113 through surface-mount reflow solder joints 111. Socket pins 105 may exhibit characteristics of a cantilever spring, as they may be bent downward toward housing 101 when engaged by land pad 405 on the front side of microprocessor 401 when the device is seated in high-k IC socket 100. Land pad 405 may be part of a land grid array (LGA) on the front side of microprocessor 401 (facing downward) that has pad-to-pad pitch in register with the pitch of socket pin holes 107 (e.g. pitch $d_1$ shown in FIG. 2 or $d_2$ and $d_3$ shown in FIG. 3). Pin bumps 109 are press-fit against sidewall 106 of socket pin holes 107, and anchor socket pins 105 to housing 101. Material 104 (e.g., having a k of at least 1 W/mK) fills the interstitial spaces between socket pin 105 and sidewall 106, displacing air (e.g., k=0.024 W/mK at 25° C.; however, some heat transfer by convection may occur) within socket pin hole 106, and providing a path of low thermal resistance between socket pin 105 and housing 101.

Bolster plate 403 is attached to a base plate (not shown) on the bottom side of PCB 113 through studs that extend through PCB 113, rigidly holding bolster plate 403 down on PCB 113 as a frame around high-k IC socket 100. Bolster plate 403 generally provides an anchoring base for bolting heat sink 402 to PCB 113. Bolster pate 403 may comprise leaf springs to react to large heat sink bolting torques without bending or warping PCB 113. Mounting studs on bolster plate 403 may pass through bolt holes (not shown) in heat sink base plate 404, and nuts on the studs may be torqued down over base plate 404 to ensure thermal contact with microprocessor 401. Thermal interface material (TIM) 406 may be present between microprocessor 401 and heat sink base plate 404 to enhance heat transfer to heat sink 402.

Bolster plate 403 may comprise lip 407 in contact with outer frame 103. Lip 406 may provide a thermal conduction path from outer frame 103 on high-k IC socket 100 to bolster plate. Heat collected by embedded mesh filaments 102 (e.g., minor filaments 102) from socket pins 105 may be collected by major filaments (e.g., major filaments 201 shown in FIG. 2) around each block (e.g., block 202) of pins, and routed to outer frame 103, through lip 407 and on to bolster plate 403. In some embodiments, bolster plate 403 comprises heat dissipation structures such as fins (not shown) to enhance heat removal from high-k IC socket 100. In some embodiments, bolster plate 403 comprises active cooling structures such as fluid circulation tubing or thermoelectric coolers (not shown) for enhancement of heat removal from high-k IC socket 100.

Figure 5:
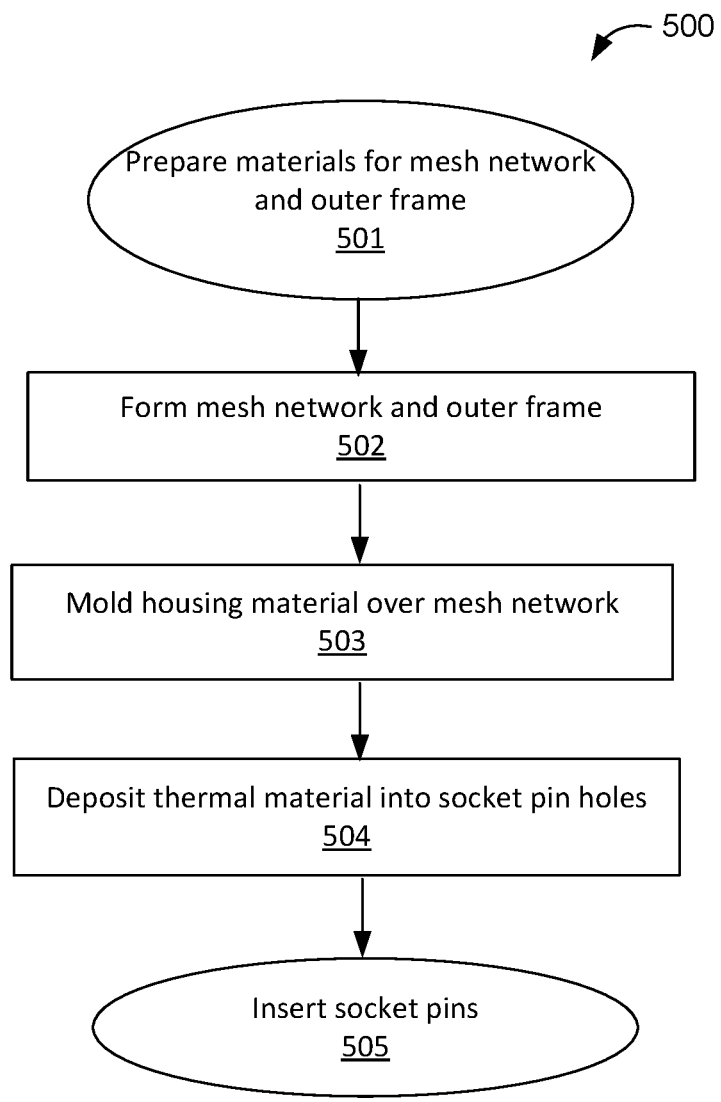
FIG. 5 illustrates a process flow chart summarizing an exemplary method of manufacture of a IC socket, according to some embodiments of the disclosure.

FIG. 5 illustrates process flow chart 500 summarizing an exemplary method of manufacture of high-k IC socket 100, according to some embodiments of the disclosure.

At operation 501, materials are prepared for formation of a heat transfer mesh network (e.g., mesh network 200 or 300) that is to be an internal framework within an IC socket housing (e.g., housing 101). An outer frame may enclose the mesh network, and terminate mesh filaments. The mesh network and outer frame may be an integral structure. Several fabrication processes may be employed to form the structure. Preparation of materials depends on the process for forming the mesh structure, described below in the subsequent operation. Additive formation methods comprise processes such as, but not limited to, electroforming (e.g., electroplating) and 3D printing. Subtractive formation methods comprise processes such as, but not limited to, laser cutting and chemical etching of metal sheets.

For additive formation methods, structural precursors are prepared as electroplating baths for electroforming, or printing "inks" for 3D printing. The precursors are prepared as liquids, such as a plating bath that comprises metal ions, such as copper ions. A plating mold may be prepared for plating the metal into a pattern of openings in the mold. The plating mold may be a thick plating mask formed from a photoresist material. As an example, a LIGA (e.g., a German acronym "Lithographie, Galvanoformung, Abformung", meaning Lithography, Electroplating and Molding) process may be employed to prepare an electroplating mold having high aspect ratio features in a thick photoresist using short wave ultraviolet light or X-rays to expose a thick photoresist. LIGA is a processes to form deep high-aspect ratio openings in a thick photoresist that may be several millimeters thick. The mold may have a thickness of 1000 microns or more. The metal precursor may be in the form of dissolved salts of the metal in an aqueous or a non-aqueous electroplating bath.

For 3D printing, the "ink" that is printed may comprise dissolved metal ions or fine metal particles suspended in an aqueous or organic matrix. The pattern of the structure to be printed may be encoded in G-code or a similar CNC (Computer Numerical Control) software language, and a computer may command movement of the print head according to the encoded pattern.

At operation 502, formation of the mesh network may be performed by any of four principle methods, as mentioned above. Additive methods may comprise electroforming (e.g., electroplating) and 3D printing.

In some embodiments, the mesh network/frame structure is formed by electroplating a suitable metal, such as, but not limited to, copper, gold or nickel into a mold prepared from a thick photoresist, as described above. The mold may have high-aspect ratio openings, into which the material is plated to form the major and minor filaments of mesh networks 200 and 300. Molds may range in thicknesses up to 2000 or 3000 microns. In some embodiments, the mold comprises patterned openings defining minor filaments, major filaments and the outer frame structure. In some embodiments, all elements of the mesh network pattern may be substantially contiguous. When formed, the resulting structure is contiguous. As an example, minor filaments may be metallurgically integral with major filaments, and an outer frame that may be metallurgically integral with both minor and major filaments.

In some embodiments, the mesh network/frame structure is formed by 3D printing. A print head of a 3D printing tool is commanded to print a precursor "ink" in a three-dimensional pattern encoded in computer software. In a manner similar to electroforming, the resulting structure may be substantially contiguous, comprising minor filaments metallurgically integral with major filaments, and an outer frame metallurgically integral with major and minor filaments. A sintering step may follow the 3D printing process if metal particles are employed.

Subtractive methods of forming the mesh network/frame structure may comprise laser cutting or chemical etching of metal sheets, for example. In some embodiments, the mesh network/frame structure is formed by laser cutting of metal sheet. As an example, a 500 micron-thick copper, nickel, aluminum or steel foil may be patterned into multiple mesh structures by laser cutting inter-filament regions to define major and minor filaments for formation of the mesh network/frame structure. A neodymium; yttrium-aluminum-garnet (Nd:YAG) infrared laser ($\lambda$~1064 nm) or a $CO_2$ laser ($\lambda$~9-12 microns) may be employed to generate the cutting beam. Features as small as 50 microns may be formed by current laser cutting techniques. Laser cutting may produce fully formed contiguous mesh networks (e.g., mesh networks 200 or 300) and outer frame (e.g., outer frame 103). The laser head may be actuated by computer-controlled motors commanded by CNC software, such as G-code, where the two-dimensional mesh pattern is encoded. Motion of the laser head directs the beam in the cutting pattern.

In some embodiments, the mesh network/frame structure is formed by chemical etching of metal foils. A wet etch may be employed, comprising an appropriate etchant for the metal to be etched. As an example, an iodine/iodide etchant may be employed for wet etching of a 500 micron-thick copper foil through an etch mask. The etch mask may be a negative photoresist material deposited on the foil, and patterned to have openings in the pattern of the open spaces between filaments of the mesh network to be formed.

An acid etchant such as a sulfuric acid/hydrogen peroxide mixture (e.g., "piranha" solution) may be also employed as a metal etchant. A variety of metals may be etched by this etchant, including nickel and steel. In a manner similar to the iodine/iodide etchant, an etch mask formed from a photoresist may be deposited and patterned on the target foil. Dimensions of mask features may be adjusted to compensate for under-etch.

At operation 503, the housing of the IC socket (e.g., housing 101) is formed by molding an appropriate material over the mesh network. An example of a high-k molding material is an epoxy resin composite have a filler of aluminum nitride or boron nitride. An injection molding process may be employed. The mesh network structure may be inserted in the mold and covered by the molten resin composite. The entire array of socket pin holes (e.g., socket pin holes 107) may be formed simultaneously in the housing by the injection molding technique. The entire housing may be formed in a single step.

In some embodiments, the housing is 3D printed along with the mesh network. A multiple material process may be employed to print the mesh network and the housing simultaneously.

At operation 504, thermal grease, or the like, is inserted into the socket pin holes (e.g. socket pin holes 107). In some embodiments, the thermal grease or thermal gel is diluted in a volatile solvent, such as isopropyl alcohol, to reduce viscosity. The mixture may then spread over the molded housing as a low-viscosity liquid, entering the socket pin holes by capillary action. After filling the socket pin holes, the solvent may be evaporated, leaving behind the thermal grease or gel behind. In some embodiments, thermal grease or gel in neat form is screen printed over the molded housing, and forced into the socket pin holes by the screen printing tool. Thermal material may be screen printed over the land side (e.g., bottom surface 112) or the die side (e.g., top surface 115), forcing the material into the pin holes by the spreading tool. The spreading tool may be a squeegee or a bladed tool.

At operation 505, socket pins are inserted into the socket pin holes. In some embodiments, pins are press-fit into the holes by a pick-and-place operation, where pins are inserted into the pin holes robotically. Pins may be laser cut from a copper sheet. The cutting process may produce specific shape outlines of the pins. A pin shape may having a specific taper and protrusions. As an example, bumps 109 are protrusions along the pin. Once inserted, the bumps 109 secure the pin to the housing. The pin may then be cut from the wire and bent to produce a hook-like structure, having a foot that is an approximately right-angle bend below the hole on the bottom side of the housing.

FIGS. 6A-6D illustrate the exemplary method for assembling IC socket 100 according to the method illustrated in FIG. 5, showing the evolution of IC socket structures at some operations, according to some exemplary embodiments.

Figure 6A:
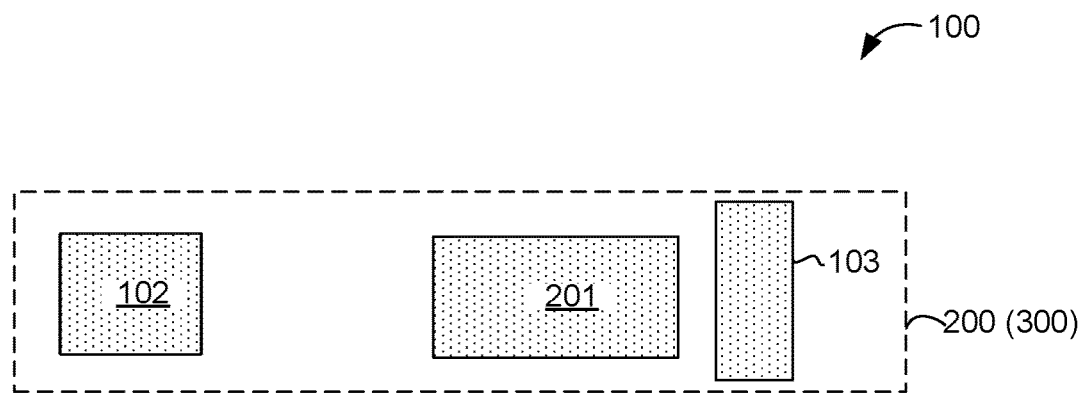
FIGS. 6A-6D illustrate the exemplary method for assembling an IC socket as summarized in FIG. 5, showing the evolution of IC socket structures at key operations, according to embodiments of the disclosure.

In FIG. 6A, mesh network 200 is formed by the methods enumerated above for operation 502 in FIG. 5. Mesh network 200 comprises minor filaments 102 and major filaments 201 that extend to outer frame 103. As described above, minor filaments 102, major filaments 201 and outer frame 103 may be integrally joined together. In some embodiments, hexagonal mesh network 300 may be formed by the same processes.

Figure 6B:
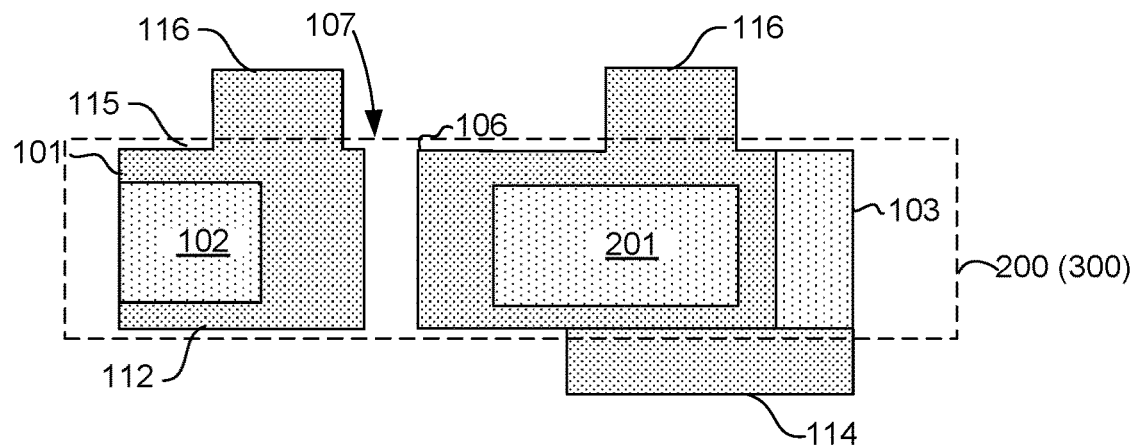

In FIG. 6B housing 101 is formed over mesh network 200. Housing 101 may be formed by injection molding a high-k resin composite over mesh network 200 (or mesh network 300). A mold for the injection molding tool may have a cavity for insertion of mesh network 200 or 300. The complex three-dimensional geometry of housing 101 comprising protrusions, such as bottom standoffs 114 extending below bottom surface 112, and upper standoffs 116 extending above top surface 115, may be incorporated into the shape of the mold cavity.

The high-k resin composite may comprise an epoxy resin and a filler such as, but not limited to, aluminum nitride, boron nitride and diamond. Aluminum nitride has a K ranging between 140 and 170 W/mK. Boron nitride has a k ranging between 600 and 740 W/mK. Diamond has a k ranging between 600 and 2000 W/mK.

Mesh network 200 (300) may be inserted into the injection mold cavity to enable overmolding. Socket pin holes 107 may be formed simultaneously with the body of housing 101. In some embodiments, housing 101 is formed simultaneously with mesh network 200 or 300 by a 3D printing process. Multiple print heads may be employed to print materials for both the mesh network and the housing. Suitable materials for the respective structures have been described above.

Figure 6C:
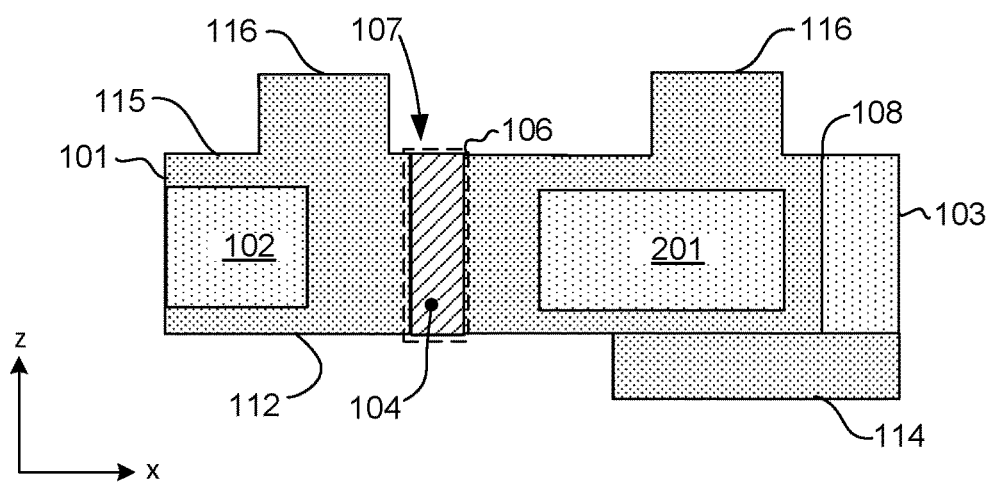

In FIG. 6C, material 104 is inserted into socket pin holes 107. Material 104 may comprise a thermal grease or a thermal gel having a thermal conductivity (k) of 1 W/mK or greater. In some embodiments, material 104 is dissolved in a volatile solvent that is compatible with the housing material. As an example, material 104 may be dissolved in an alcohol such as isopropyl alcohol. Material 104 may then be introduced into socket pin holes 107 by capillarity.

In some embodiments, material 104 is screen printed by spreading the material onto a surface of housing 101 (e.g., with a squeegee or bladed spreading device) and forcing the material into socket pin holes 107. Material 104 may be screen printed either neat or in diluted, and spread over bottom surface 113, or over top surface 115. Excess thermal material on bottom and top surfaces 112 and 115, respectively, may be washed off with a solvent after the screen printing operation.

Figure 6D:
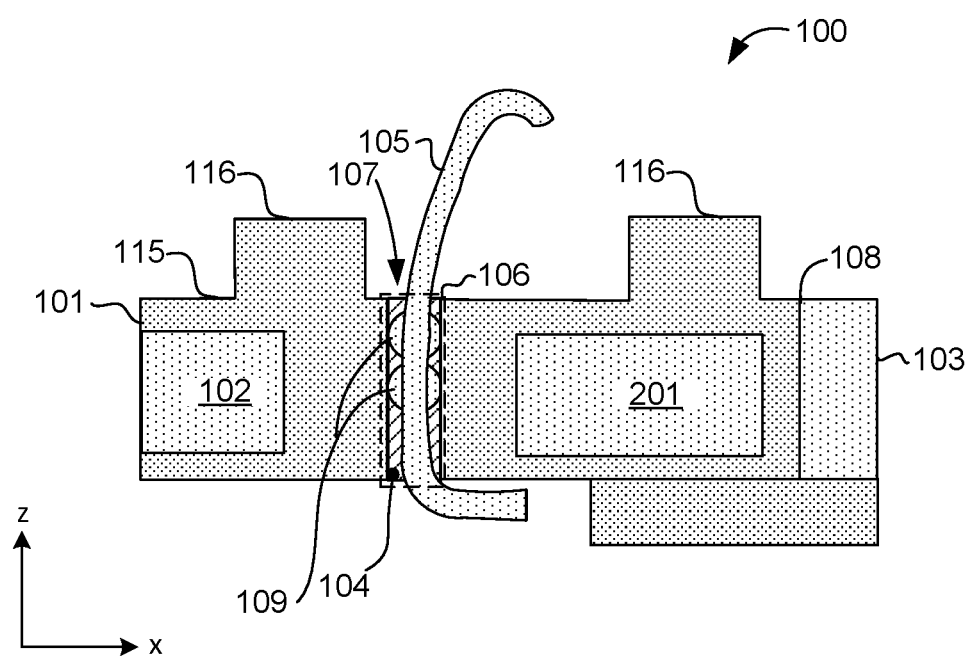

In FIG. 6D, socket pins 105 are inserted into socket pin holes 107 to finish the assembly of high-k IC socket 100. Pins 105 may be formed by laser cutting from a copper sheet. The insertion of pins 105 may be performed by a pick-and-place operation, inserting pins 105 into socket pin holes 107 by a press fit. Bumps 109 may have sufficient width to press against hole sidewalls 106, anchoring socket pins 105 to pin holes 107. Material 104 may remain in a low-viscosity diluted state to flow around bumps 109 during insertion of pins 105.

Figure 7:
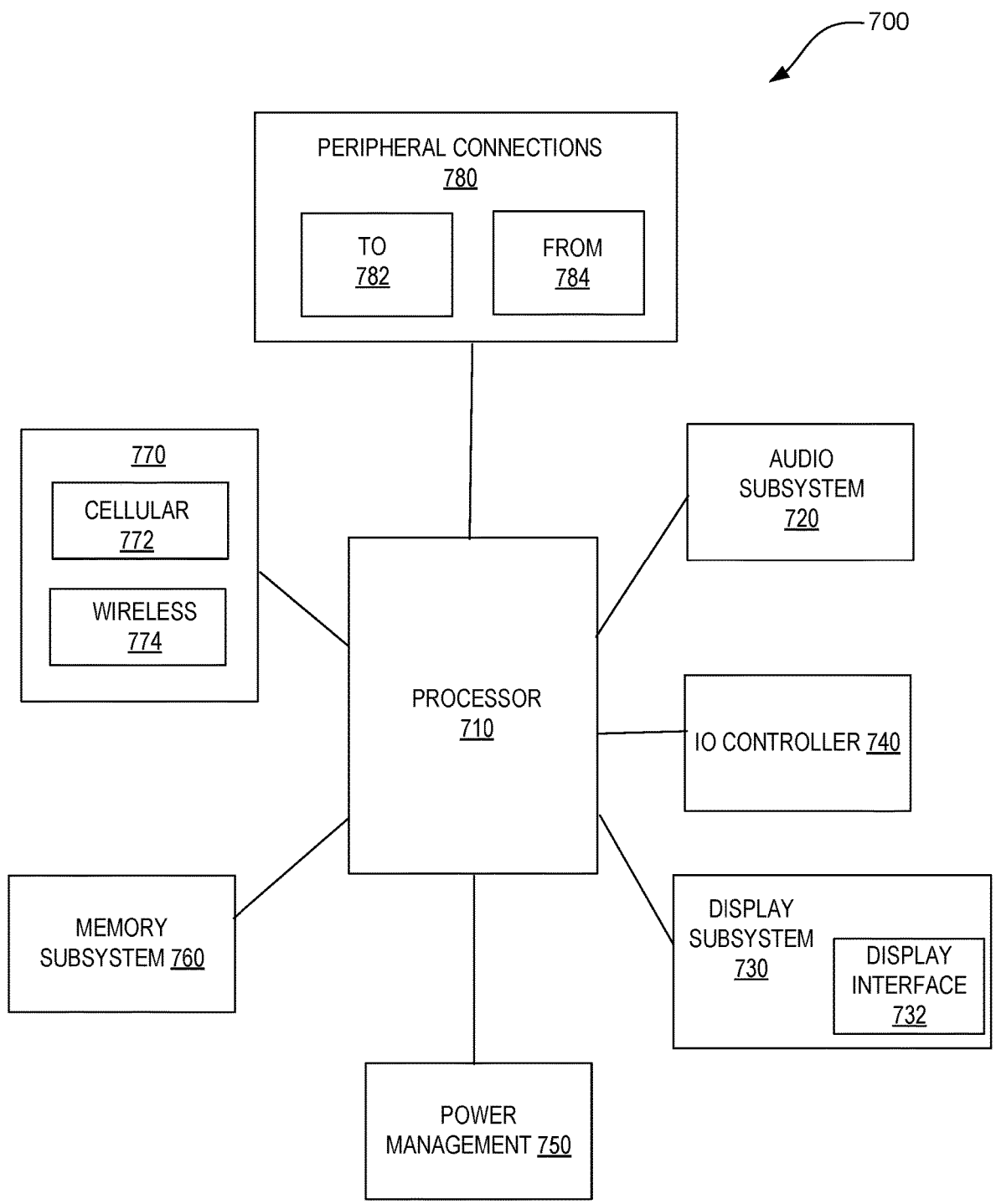
FIG. 7 illustrates a block diagram of a computing device comprising a IC socket for seating a system-on-chip (SoC) package in an implementation of a computing device, according to some embodiments of the disclosure.

FIG. 7 illustrates a block diagram of computing device 700 comprising high-k IC socket 100 for seating a system-on-chip (SoC) package in an implementation of a computing device, according to some embodiments of the disclosure.

According to some embodiments, computing device 700 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., processor 510 representing a central processing unit (CPU) or a graphical processing unit (GPU)), comprising one or more dies, may be mounted on IC socket 100 on a motherboard of computing device 500. The IC package may comprise vertically integrated multiple dies or stacked individual packages in a package-on-package (PoP) architecture. In all architectures, IC packages may dissipate a large amount of heat during burst activity periods, when large computing demands are placed on the CPU or GPU. Large $I^2R$ power dissipation in the socket pins results in heating of the socket. A socket according to the disclosed embodiments may mitigate the effects of excessive pin heating due to high $I^2R$ dissipation.

In some embodiments, computing device has wireless connectivity (e.g., Bluetooth and/or WiFi). It will be understood that certain components are shown generally, and not all components of such a device are shown in computing device 700.

The various embodiments of the present disclosure may also comprise a network interface within 770 such as a wireless interface so that a system embodiment may be incorporated into a wireless device, for example, cell phone or personal digital assistant.

According to some embodiments, processor 710 represents a CPU or a GPU, and can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting the computing device 700 to another device. The processing operations may also include operations related to audio I/O and/or display I/O.

In one embodiment, computing device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 700, or connected to the computing device 700. In one embodiment, a user interacts with the computing device 700 by providing audio commands that are received and processed by processor 710.

Display subsystem 730 represents hardware (e.g., display devices) and software (e.g., drivers) components that provide a visual and/or tactile display for a user to interact with the computing device 700. Display subsystem 730 includes display interface 732 which includes the particular screen or hardware device used to provide a display to a user. In one embodiment, display interface 732 includes logic separate from processor 710 to perform at least some processing related to the display. In one embodiment, display subsystem 730 includes a touch screen (or touch pad) device that provides both output and input to a user.

I/O controller 740 represents hardware devices and software components related to interaction with a user. I/O controller 740 is operable to manage hardware that is part of audio subsystem 720 and/or display subsystem 730. Additionally, I/O controller 740 illustrates a connection point for additional devices that connect to computing device 700 through which a user might interact with the system. For example, devices that can be attached to the computing device 700 might include microphone devices, speaker or stereo systems, video systems or other display devices, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of the computing device 700. Additionally, audio output can be provided instead of, or in addition to display output. In another example, if display subsystem 730 includes a touch screen, the display device also acts as an input device, which can be at least partially managed by I/O controller 740. There can also be additional buttons or switches on the computing device 700 to provide I/O functions managed by I/O controller 740.

In one embodiment, I/O controller 740 manages devices such as accelerometers, cameras, light sensors or other environmental sensors, or other hardware that can be included in the computing device 700. The input can be part of direct user interaction, as well as providing environmental input to the system to influence its operations (such as filtering for noise, adjusting displays for brightness detection, applying a flash for a camera, or other features).

In one embodiment, computing device 700 includes power management 750 that manages battery power usage, charging of the battery, and features related to power saving operation. Memory subsystem 760 includes memory devices for storing information in computing device 700. Memory can include nonvolatile (state does not change if power to the memory device is interrupted) and/or volatile (state is indeterminate if power to the memory device is interrupted) memory devices. Memory subsystem 760 can store application data, user data, music, photos, documents, or other data, as well as system data (whether long-term or temporary) related to the execution of the applications and functions of the computing device 700.

Elements of embodiments are also provided as a machine-readable medium (e.g., memory 760) for storing the computer-executable instructions. The machine-readable medium (e.g., memory 760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 770 includes hardware devices (e.g., wireless and/or wired connectors and communication hardware) and software components (e.g., drivers, protocol stacks) to enable the computing device 700 to communicate with external devices. The computing device 700 could be separate devices, such as other computing devices, wireless access points or base stations, as well as peripherals such as headsets, printers, or other devices.

Network interface 770 can include multiple different types of connectivity. To generalize, the computing device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 774 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 780 include hardware interfaces and connectors, as well as software components (e.g., drivers, protocol stacks) to make peripheral connections. It will be understood that the computing device 700 could both be a peripheral device ("to" 782) to other computing devices, as well as have peripheral devices ("from" 784) connected to it. The computing device 700 commonly has a "docking" connector to connect to other computing devices for purposes such as managing (e.g., downloading and/or uploading, changing, synchronizing) content on computing device 700. Additionally, a docking connector can allow computing device 700 to connect to certain peripherals that allow the computing device 700 to control content output, for example, to audiovisual or other systems.

In addition to a proprietary docking connector or other proprietary connection hardware, the computing device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an integrated circuit (IC) socket, comprising a housing comprising a land side and an opposing die side and sidewalls around a perimeter of the housing, the housing comprising a first dielectric; a plurality of socket pins extending from the land side of the housing through socket pin holes in the housing to at least a z-height over the die side; a frame structure extending around at least a portion of the perimeter of the housing; and a mesh structure embedded within the first dielectric, the mesh structure having a plurality of mesh filaments extending between the plurality of socket pin holes and coupled to the frame structure.

Example 2 includes all of the features of example 1, further comprising a second dielectric having a thermal conductivity of at least 1 W/mK, the second dielectric within the interstitial regions between the socket pins and sidewalls of the socket pin holes.

Example 3 includes all of the features of examples 1 or 2, wherein the first dielectric has a thermal conductivity of at least 140 W/mK.

Example 4 includes of all the features of any one of examples 1 to 3, the plurality of mesh filaments comprises a first plurality of mesh filaments and a second plurality of mesh filaments, wherein the first plurality and second plurality of mesh filaments extend between the sidewalls of the housing, wherein the first plurality of mesh filaments are metallurgically coupled to the second plurality of mesh filaments, wherein a first width of first plurality of mesh filaments is smaller than a second width of the second plurality of mesh filaments.

Example 5 includes all of the features of example 4, the first plurality of mesh filaments is coupled to the frame structure, and the second plurality of mesh filaments is coupled to the frame structure.

Example 6 includes all of the features of examples 4 or 5, wherein the first plurality and the second plurality of mesh filaments extend in a first direction and in a second direction within the first dielectric, wherein the first direction is orthogonal to the second direction.

Example 7 includes all of the features of any one of examples 4 to 6, wherein the first plurality and the second plurality of mesh filaments extend in a first direction and in a second direction within the first dielectric, wherein the first direction is oblique to the second direction.

Example 8 includes all of the features of any one of examples 4 to 7, wherein the plurality of socket pins comprises two or more blocks of socket pins, wherein the second plurality of mesh filaments extends between the two or more blocks of socket pins, wherein the two or more blocks of socket pins are separated from one another by at least the second width of the second plurality of mesh filaments.

Example 9 includes all of the features of any one of examples 1 to 8, wherein the first plurality and second plurality of mesh structures comprise any one of copper, gold, silver, nickel or aluminum.

Example 10 includes all of the features of any one of examples 1 to 9, wherein the first dielectric is an organic polymer composite comprising ceramic particles, wherein the ceramic particles comprise any of aluminum nitride or boron nitride.

Example 11 includes all of the features of any one of examples 1 to 10, wherein the first dielectric is an organic polymer composite comprising diamond particles.

Example 12 includes all of the features of any one of examples 1 to 11, wherein the second dielectric is a thermally conductive grease or a thermally conductive gel.

Example 13 includes all of the features of any one of examples 1 to 12, wherein the thermally conducive grease or gel comprises any of aluminum nitride particles, boron nitride particles or diamond particles.

Example 14 includes all of the features of any one of examples 1 to 13, wherein the plurality of mesh filaments has a width ranging between 200 and 2000 microns.

Example 15 is a system, comprising a memory; a microprocessor coupled to the memory, wherein the microprocessor is in a package, wherein the package is seated in an IC socket, wherein the IC socket comprises: a housing comprising a land side and an opposing die side and sidewalls around a perimeter of the housing, the housing comprising a first dielectric; a plurality of socket pins extending from the land side of the housing through socket pin holes in the housing to at least a z-height over the die side; a frame structure extending around at least a portion of the perimeter of the housing; and a mesh structure embedded within the first dielectric, the mesh structure having a plurality of mesh filaments extending between the plurality of socket pin holes and coupled to the frame structure; a bolster plate mounted on the printed circuit board, wherein the bolster plate is a frame structure that surrounds the IC socket; and a power source coupled to the package.

Example 16 includes all of the features of example 15, wherein the bolster plate is thermally coupled to the frame structure of the IC socket.

Example 17 includes all of the features of example 15, wherein an underfill material is between solder joints that couple the IC socket o the printed circuit board, wherein the under fill material has a thermal conductivity of at least 1 w/mK.

Example 18 is a method for making an IC socket, comprising: forming a framework comprising a frame structure around a mesh structure, wherein the mesh structure is integral with the frame structure; forming a socket housing, wherein the socket housing comprises a first dielectric material embedding the mesh structure, wherein the frame structure is on sidewalls of the socket housing, and wherein a plurality of through-holes extend through the socket housing; and inserting a plurality of socket pins in the plurality of through-holes, wherein the plurality of socket pins is thermally coupled to the first dielectric material of the socket housing by the second dielectric material.

Example 19 includes all of the features of example 18, further comprising depositing a second dielectric material in the plurality of through-holes, wherein the second dielectric material comprises a thermal grease or a thermal gel.

Example 20 includes all of the features of examples 18 or 19, wherein depositing a second dielectric in the plurality of through holes comprises screen printing the second dielectric into the plurality of through-holes, wherein the second dielectric is a thermal grease or a thermal gel, and wherein the second dielectric is neat or is diluted in a solvent.

Example 21 includes all of the features of any one of examples 18 to 20, wherein forming the framework comprising a frame structure and a mesh structure comprises electroplating a metal in openings of a mold, wherein the mold has a plurality of openings that define the shape of frame structure and the mesh structure.

Example 22 includes all of the features of any one of examples 18 to 21, wherein forming the socket housing comprises molding the first dielectric over the framework, wherein the first dielectric is flowed into a mold the contains the framework and is cured to a hardened state, wherein the first mesh structure is embedded within the first dielectric.

Example 23 includes all of the features of any one of examples 18 to 22, wherein forming the socket housing comprises 3D printing the framework and the first dielectric simultaneously.

Example 24 includes all of the features of any one of examples 18 to 23, wherein forming the socket housing comprises forming the plurality of through-holes in the socket housing, wherein the through-holes are formed as blocks, each block having a portion of the plurality of through-holes, wherein the blocks are separated by a distance that is at least a width of a major filament of the mesh structure.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit (IC) socket, comprising:
   a housing comprising a land side and an opposing die side and sidewalls around a perimeter of the housing, the housing comprising a first dielectric;
   a plurality of socket pins extending from the land side of the housing through socket pin holes in the housing to at least a z-height over the die side;
   a frame structure extending around at least a portion of the perimeter of the housing; and
   a mesh structure embedded within the first dielectric, the mesh structure having a plurality of mesh filaments extending between the plurality of socket pin holes and coupled to the frame structure;
   a second dielectric between the socket pins and sidewalls of the socket pin holes.

2. The IC socket of claim 1, wherein the second dielectric has a thermal conductivity of at least 1 W/mK.

3. The IC socket of claim 1, wherein the first dielectric has a thermal conductivity of at least 140 W/mK.

4. The IC socket of claim 1, wherein the plurality of mesh filaments comprises a first plurality of mesh filaments and a second plurality of mesh filaments, wherein the first plurality and second plurality of mesh filaments extend between the sidewalls of the housing, wherein individual ones of the first plurality of mesh filaments are metallurgically coupled to individual ones of the second plurality of mesh filaments.

5. The IC socket of claim 4, wherein the first plurality of mesh filaments is coupled to the frame structure, and the second plurality of mesh filaments is coupled to the frame structure.

6. The IC socket of claim 4, wherein the first plurality and the second plurality of mesh filaments extend in a first direction and in a second direction within the first dielectric, wherein the first direction is orthogonal to the second direction.

7. The IC socket of claim 4, wherein the first plurality and the second plurality of mesh filaments extend in a first direction and in a second direction within the first dielectric, wherein the first direction is oblique to the second direction.

8. The IC socket of claim 4, wherein the plurality of socket pins comprises two or more blocks of socket pins, wherein the second plurality of mesh filaments extends between the two or more blocks of socket pins, wherein the two or more blocks of socket pins are separated from one another by at least the second width of the second plurality of mesh filaments.

9. The IC socket of claim 4, wherein the first plurality and the second plurality of mesh structures comprise any one of copper, gold, silver, nickel or aluminum.

10. The IC socket of claim 1, wherein the first dielectric is an organic polymer composite comprising ceramic particles, wherein the ceramic particles comprise any of aluminum nitride or boron nitride.

11. The IC socket of claim 1, wherein the first dielectric is an organic polymer composite comprising diamond particles.

12. The IC socket of claim 1, wherein the second dielectric is a thermally conductive grease or a thermally conductive gel.

13. The IC socket of claim 12, wherein the thermally conductive grease or gel comprises any of aluminum nitride particles, boron nitride particles or diamond particles.

14. The IC socket of claim 1, wherein the plurality of mesh filaments has a width ranging between 200 and 2000 microns.

15. A system comprising:
    a memory;
    a microprocessor coupled to the memory, wherein the microprocessor is in a package, wherein the package is seated in an IC socket, wherein the IC socket comprises:
      a housing comprising a land side and an opposing die side and sidewalls around a perimeter of the housing, the housing comprising aluminum nitride, boron nitride or diamond;
      a plurality of socket pins extending from the land side of the housing through socket pin holes in the housing to at least a z-height over the die side;
      a frame structure extending around at least a portion of the perimeter of the housing; and
      a mesh structure embedded within the housing, the mesh structure having a plurality of mesh filaments extending between the plurality of socket pin holes and coupled to the frame structure;
    a thermally conductive grease or a thermally conductive gel between the socket pins and sidewalls of the socket pin holes;
    a bolster plate mounted on the printed circuit board, wherein the bolster plate is a frame structure that surrounds the IC socket; and
    a power source coupled to the package.

16. The system of claim 15, wherein the bolster plate is thermally coupled to the frame structure of the IC socket.

17. The system of claim 15, wherein an underfill material is between solder joints that couple the IC socket to the printed circuit board, wherein the underfill material has a thermal conductivity of at least 1 W/mK.

18. A method for making an IC socket, comprising:
    forming a framework comprising a frame structure around a mesh structure, wherein the mesh structure is integral with the frame structure;
    forming a socket housing, wherein the socket housing comprises a first dielectric material embedding the mesh structure, wherein the frame structure is on sidewalls of the socket housing, and wherein a plurality of through-holes extend through the socket housing; and inserting a plurality of socket pins in the plurality of through-holes, wherein the plurality of socket pins is thermally coupled to the first dielectric material of the socket housing by a second dielectric material.

19. The method for making an IC socket of claim 18, further comprising depositing a second dielectric material in the plurality of through-holes, wherein the second dielectric material comprises a thermal grease or a thermal gel.

20. The method for making an IC socket of claim 19, wherein depositing a second dielectric in the plurality of through holes comprises screen printing the second dielectric into the plurality of through-holes, wherein the second dielectric is a thermal grease or a thermal gel, and wherein the second dielectric is neat or is diluted in a solvent.

* * * * *